United States Patent
Fu

(12) 
(10) Patent No.: US 6,388,910 B1
(45) Date of Patent: May 14, 2002

(54) NOR TYPE MASK ROM WITH AN INCREASED DATA FLOW RATE

(75) Inventor: Chien-Chih Fu, Hsin-Chu (TW)

(73) Assignee: AMIC Technology (Taiwan) Inc., Hsin-Chu Hsien (TW)

(*) Notice: Subject to any disclaimer, the term of this patent is extended or adjusted under 35 U.S.C. 154(b) by 0 days.

(21) Appl. No.: 09/682,301

(22) Filed: Aug. 16, 2001

(51) Int. Cl.[7] ................................................. G11C 5/06
(52) U.S. Cl. ...................... 365/51; 365/63; 365/185.11; 365/185.13
(58) Field of Search ...................... 365/51, 63, 230.03, 365/185.11, 185.13

(56) References Cited

U.S. PATENT DOCUMENTS

| | | | | |
|---|---|---|---|---|
| 5,349,563 A | * | 9/1994 | Iwase | .................... 365/230.03 |
| 5,825,683 A | * | 10/1998 | Chang | ......................... 365/104 |
| 5,923,606 A | * | 7/1999 | Lee et al. | ............... 365/230.03 |
| 6,128,210 A | * | 10/2000 | Suminaga et al. | ............. 365/63 |
| 6,226,214 B1 | * | 5/2001 | Choi | ...................... 365/230.03 |

* cited by examiner

*Primary Examiner*—Son T. Dinh
(74) *Attorney, Agent, or Firm*—Winston Hu

(57) ABSTRACT

A NOR type mask ROM includes a plurality of main bit lines formed in parallel with each other, a plurality of first sub-bit lines connected to the main bit lines through bit line contacts, a plurality of T-shaped second sub-bit lines each having a vertical arm formed in parallel with the main bit lines, and a horizontal arm formed in perpendicular with the vertical arm, and a plurality of third sub-bit lines each formed in parallel with the main bit lines and between vertical arms of two neighboring second sub-bit lines.

5 Claims, 3 Drawing Sheets

NOR TYPE MASK ROM WITH AN INCREASED DATA FLOW RATE

BACKGROUND OF INVENTION

1. Field of the Invention

The present invention relates to a mask ROM, and more particularly, to a NOR type mask ROM with an increased data flow rate.

2. Description of the Prior Art

Data transmission speed is one of the most important demands for ROM devices. Therefore, a lot of recent researches have concentrated in the area of increasing the data transmission speed of ROM devices. Please refer to FIGS. 1 and 2. FIG. 1 is a circuit diagram of a prior art NOR-type mask ROM device 10. FIG. 2 shows a layout of the ROM device 10. The ROM device 10 comprises a plurality of main bit lines ML1–ML5 formed in parallel with each other, a plurality of first sub-bit lines 12 connected to the main bit lines ML1–ML5 through bit line contacts 14, a plurality of second sub-bit lines SB1–SB9 formed in parallel with the main bit lines ML1–ML5, a plurality of word lines WL1–WL32 formed in perpendicular to the main bit lines ML1–ML5, a plurality of main bank selection lines BS1–BS3 formed in parallel with the word lines WL1–WL32 for selecting a memory block such as block 1, block 2 and block 3, and a plurality of sub-bank selection lines BSO, BSE formed within each memory block for selectively connecting neighboring second sub-bit lines SB1–SB9 so as to select a corresponding sub-bank.

In FIG. 2, a word line running across two neighboring-second sub-bit lines SB1–SB9 forms a data transistor. A main bank selection line or a sub-bank selection line running across two neighboring sub-bit lines forms a main bank selection transistor or a sub-bank selection transistor. The selection transistors designated with an "S" are maintained in the on-state when a power source voltage $V_{CC}$ is applied thereto. The selection transistors not designated with an "S" are maintained in the off-state even if a power source voltage $V_{CC}$ is applied thereto.

The operation of the ROM device 10 is as follows; Suppose the main bit line ML3 is grounded, the power source voltage $V_{CC}$ is applied to the main bit line ML2 and BS1, BSO and WL16 to select the block 1, a sub-bank corresponding to the sub-bank selection line BSO and the word line WL16, the current in the main bit line ML2 will flow through the bit line contact 14a, the first sub-bit line 12a and the selection transistor Sa to the second sub-bit line SB5. If the power source voltage $V_{CC}$ can turn on the data transistor T, the current in the second sub-bit line BS5 will continue to flow through the data transistor T, the second sub-bit line SB4, the selection transistor Sb, the second sub-bit line SB3, the selection transistor Sc, the first sub-bit line 12b and the bit line contact 14b to the main bit line ML3. If the power source voltage $V_{CC}$ can not turn on the data transistor T, the second sub-bit line SB4 will remain disconnected from the second sub-bit line SB5, thus, the current in the second sub-bit line BS5 willnot flow to the main bit line ML3. Therefore, by checking current from the main bit line ML3 after a time period, the data stored in the data transistor T can be retrieved.

The ROM device 10, however, has some drawbacks. First, each of the selection transistors has a very small channel width W. Therefore, transmitting current across the selection transistors takes a long time. Moreover, the second sub-bit line such as SB5 is positioned between two first sub-bit lines 12a, 12c. That is, the second sub-bit line SB5 is very close to the first sub-bit line 12c. This short distance may result in leakage of current from the second sub-bit line SB5 to the unrelated first sub-bit line 12c thus further reducing transmission speed of current and interfering other portions of the ROM device 10.

SUMMARY OF INVENTION

In view of the foregoing, it is a primary objective of the present invention to provide a NOR type mask ROM with an increased data flow rate and a reduced interference between different portions of the mask ROM to solve the above-mentioned problems. According to the claimed invention, the NOR type mask ROM includes a plurality of main bit lines formed in parallel with each other, a plurality of first sub-bit lines connected to the main bit lines through bit line contacts, a plurality of T-shaped second sub-bit lines each having a vertical arm formed in parallel with the main bit lines, and a horizontal arm formed in perpendicular with the vertical arm, a plurality of third sub-bit lines each formed in parallel with the main bit lines and between vertical arms of two neighboring second sub-bit lines, a plurality of word lines formed in perpendicular with the main bit lines, a plurality of main bank selection lines formed in parallel with the word lines for selecting a memory block, and a plurality of sub-bank selection lines formed within each memory block for selectively connecting neighboring second and third sub-bit lines so as to select a corresponding sub-bank.

It is therefore an advantage of the claimed invention t hat the NOR type m ask ROM comprises T-shaped second sub-bit line s which greatly increase channel widths of selection transistors and are formed far away from the unrelated first sub-bit lines to reduce interferences between unrelated portion of the mask ROM. These and other objectives and advantages of the present invention will no doubt become obvious to those of ordinary skill in the art after having read the following detailed description of the preferred embodiment that is illustrated in the various figures and drawings.

DETAILED DESCRIPTION

Figure 1:
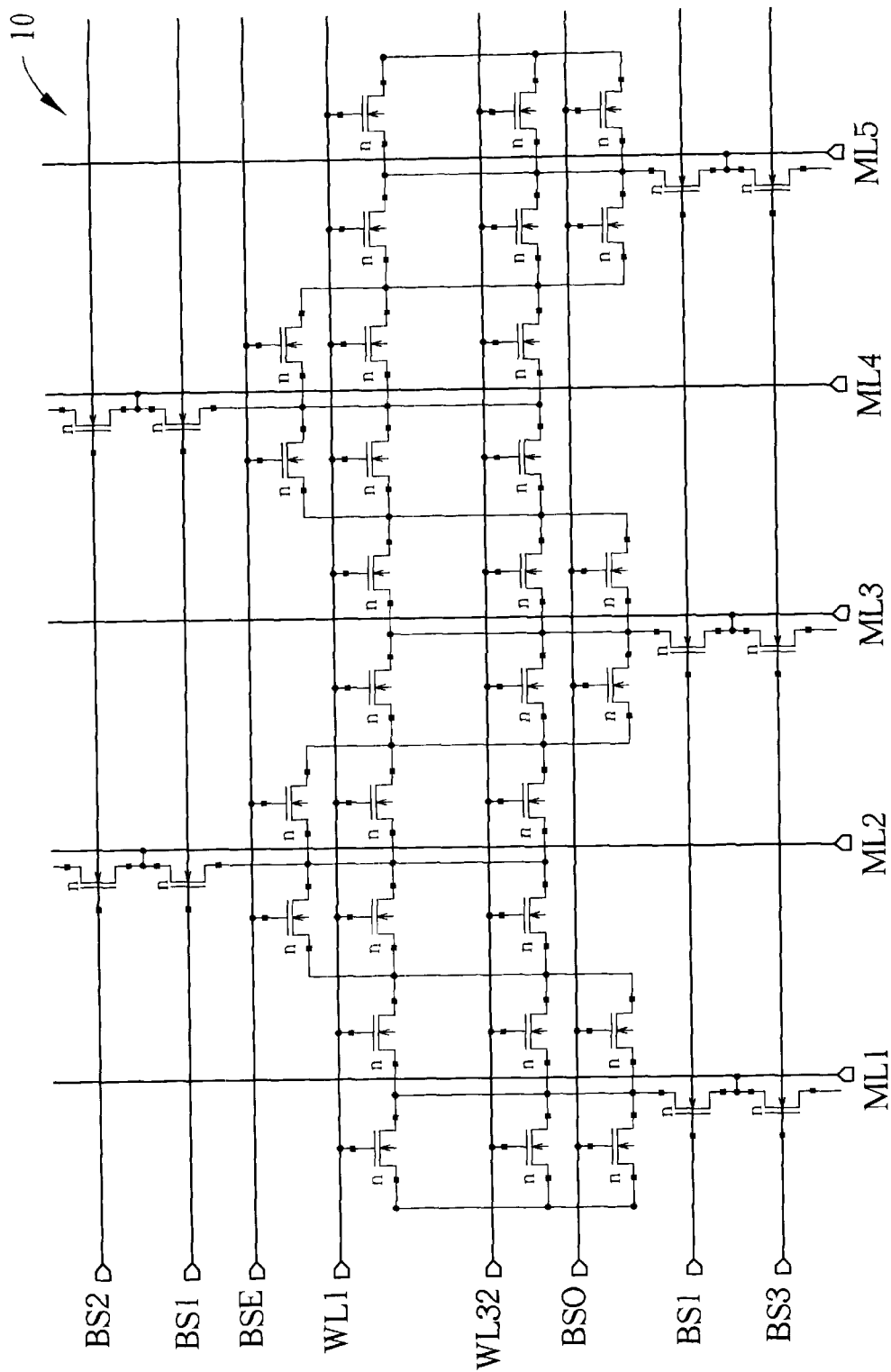
FIG. 1 is a circuit diagram of a prior art o NOR-type mask ROM device.
Figure 2:
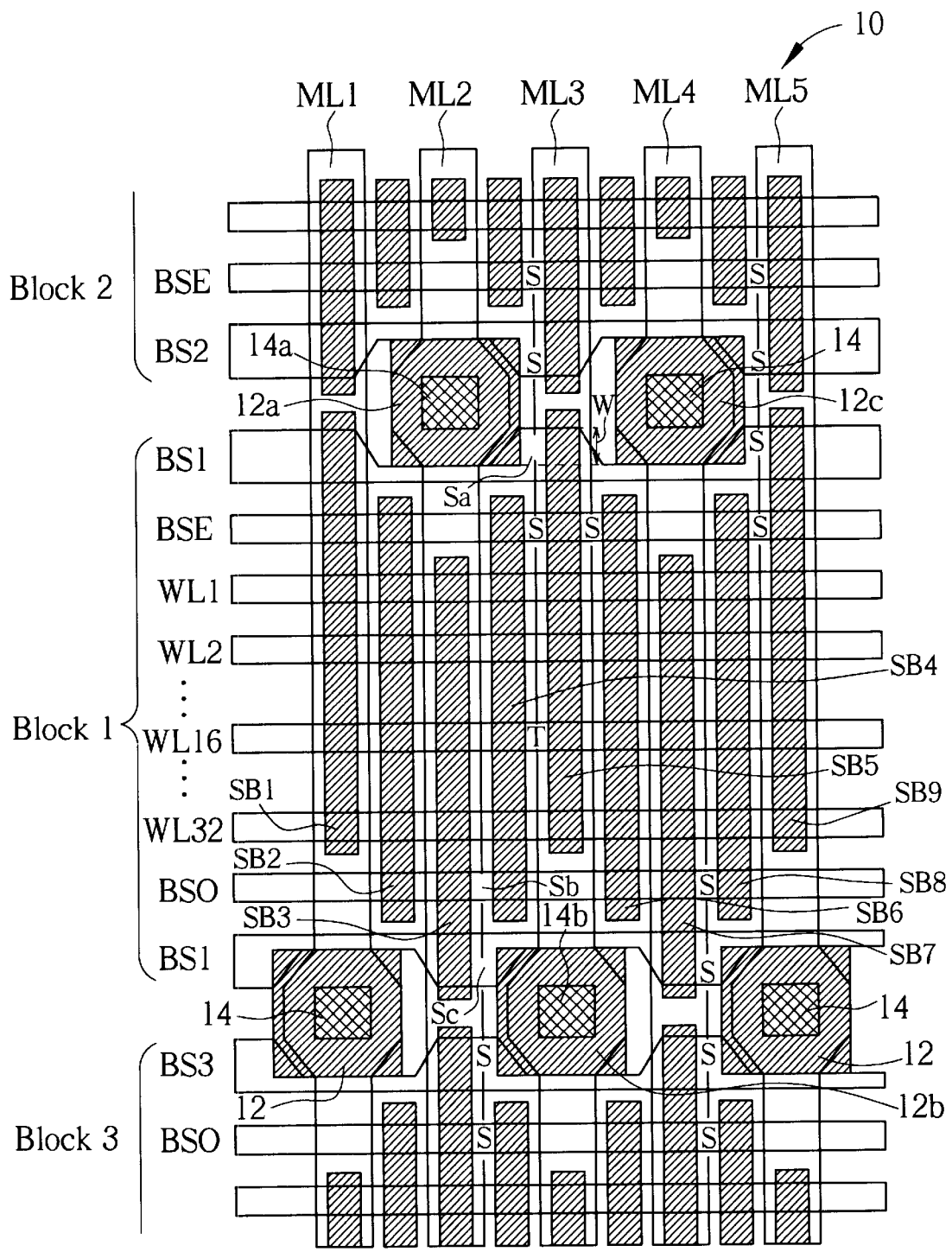
FIG. 2 shows a layout of the ROM device in FIG. 1.
Figure 3:
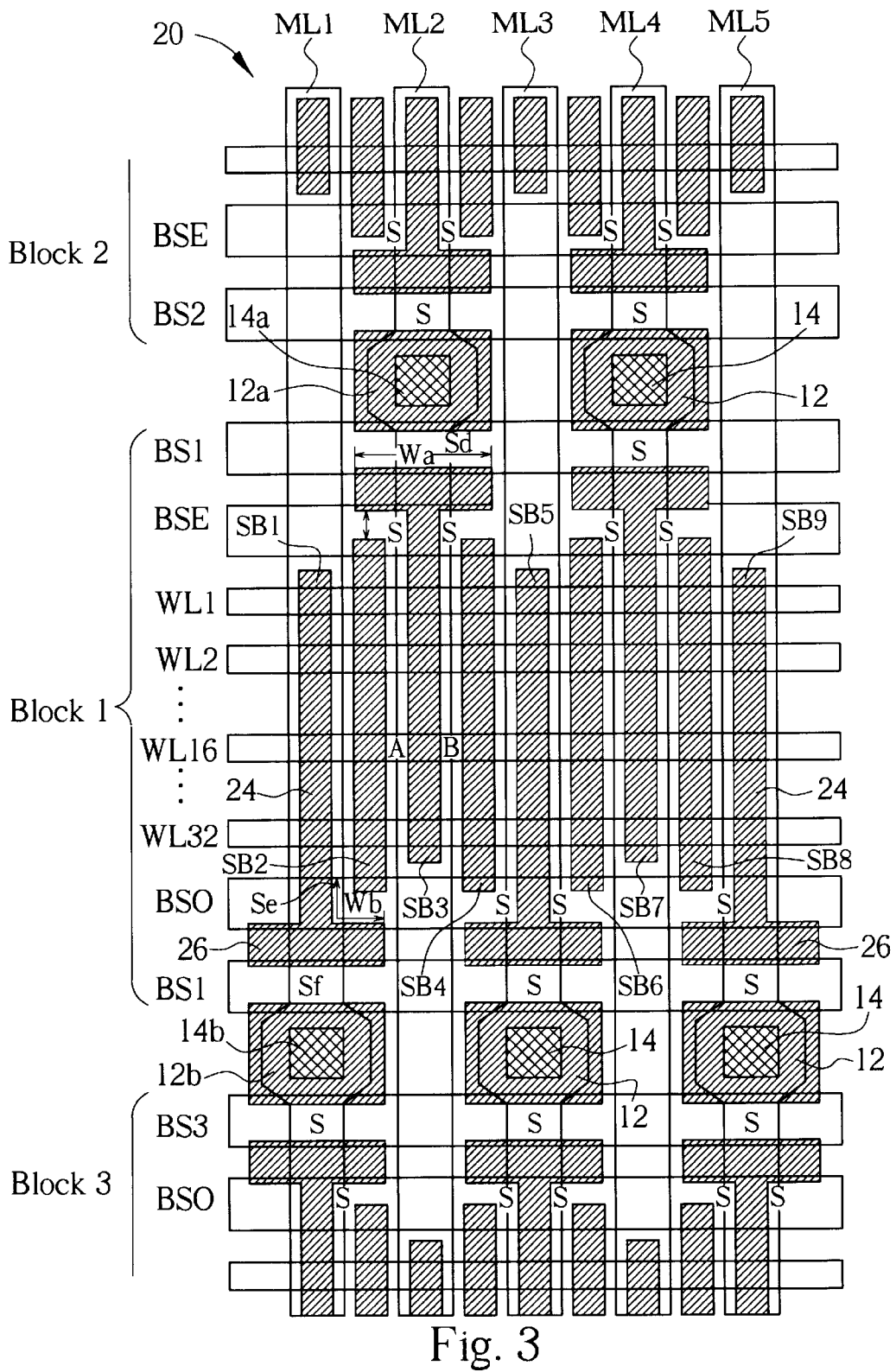
FIG. 3 shows a layout of a NOR type mask ROM device according to the present invention.

Please refer to FIG. 3. FIG. 3 shows a layout of a NOR type mask ROM device 20 according to the present invention. The ROM device 20 comprises a plurality of main bit lines ML1–ML5 formed in parallel with each other, a plurality of first sub-bit lines 12 connected to the main bit lines ML1–ML5 through bit line contacts 14, a plurality of T-shaped second sub-bit lines SB1, SB3, SB5, SB7, SB9 each having a vertical arm 24 formed in parallel with the main bit lines ML1 ML5, and a horizontal arm 26 formed in perpendicular with the vertical arm 24. The ROM device 20 further comprises a plurality of third sub-bit lines SB2, SB4, SB6, SB8 each formed in parallel with the main bit lines ML1–ML5 and between vertical arms 24 of two neighboring second sub-bit lines, a plurality of word lines WL1–WL32 formed in perpendicular with the main bit lines ML1–ML5, a plurality of main bank selection lines BS1–BS3 formed in parallel with the word lines WL1–WL32 for selecting a memory block such as block 1, block 2 and block 3, and a plurality of sub-bank selection lines BSO, BSE formed within each memory block for selectively connecting neighboring second and third sub-bit lines SB1–SB9 so as to select a corresponding sub-bank.In FIG. 3, a word line running across two neighboring second and third sub-bit lines SB1–SB9 forms a data transistor. A selection line running across two neighboring sub-bit lines forms a selection transistor. The selection transistors designated with an "S" are maintained in the on-state when a power source voltage $V_{CC}$ is applied thereto. The selection transistors not designated with an "S" are maintained in the off-state even if a power source voltage $V_{CC}$ is applied thereto. The operation of the ROM device 20 is as follows: Suppose the main bit line ML1 is grounded, the power source voltage $V_{CC}$ is applied to the main bit line ML2 and BS1, BSO and WL16 to select the block 1, a sub-bank corresponding to the sub-bank selection line BSO and the word line WL16, the current in the main bit line ML2 will flow through the bit line contact 14a, the first sub-bit line 12a and the selection transistor Sd to the second sub-bit line SB3. If the power source voltage $V_{CC}$ can turn on the data transistor A, the current in the second sub-bit line BS3 will continue to flow through the data transistor A, the third sub-bit line SB2, the selection transistor Se, the second sub-bit line SB1, the selection transistor Sf, the first sub-bit line 12b and the bit line contact 14b to the main bit line ML1. If the power source voltage $V_{CC}$ can not turn on the data transistor A, the second sub-bit line SB3 will remain disconnected from the third sub-bit line SB2, thus, the current in the second sub-bit line BS3 will not flow to the main bit line ML1. Therefore, by checking current from the main bit line ML1 after a time period, the data stored in the data transistor A can be retrieved. Likewise, if the main bit line ML3 is grounded and the power source voltage $V_{CC}$ is applied to the main bit line ML2 and BS1, BSO and WL16 to select the block 1, a sub-bank corresponding to the sub-bank selection line BSO and the word line WL16, the data stored in the data transistor B can be retrieved by checking current in the main bit line ML3 after a time period. The second sub-bit lines SB3, SB3, SB5, SB7, SB9 are of a T-shape. The layout of the ROM device 20 has a few advantages: First, the main bank selection transistors each formed by a first sub-bit line, the horizontal arm of a second sub-bit line and a main bank selection line have a channel width Wa corresponding to the length of the horizontal arm of a second sub-bit line. Compared with the prior art selection transistors at corresponding positions such as Sa in FIG. 2, the main bank selection transistors of the present invention such as Sd have a roughly doubled channel width. Moreover, the sub-bank selection transistors each formed by a second sub-bit line, a third sub-bit line and a sub-bank selection line such as Se have a channel width Wb that is also about twice as long as the prior art selection transistors at corresponding positions such as Sb in FIG. 2. Because the selection transistors in FIG. 3 has a much longer channel width than the channel widths of selection transistors of the prior art, data transmission speed is greatly enhanced. Further, the horizontal arm of a second sub-bit line is far away from unrelated first sub-bit lines and thus is highly isolated from unrelated first sub-bit lines. This further increases transmission speed of data.

Compared with the prior art, the selection transistors each have a long channel width. And the horizontal arm of each second sub-bit line is far away from unrelated first sub-bit lines. Therefore, data stored in the data transistors can be retrieved quickly, and current is unlikely flow into unrelated first sub-bit lines when flowing through selection transistors.

Those skilled in the art will readily observe that numerous modifications and alterations of the device may be made while retaining the teachings of the invention. Accordingly, the above disclosure should be understood to be limited only by the bounds of the following claims.

What is claimed is:

1. A NOR type mask ROM comprising:

a plurality of main bit lines formed in parallel with each other;

a plurality of first sub-bit lines connected to the main bit lines through bit line contacts;

a plurality of T-shaped second sub-bit lines each having a vertical arm formed in parallel with the main bit lines, and a horizontal arm formed in perpendicular with the vertical arm;

a plurality of third sub-bit lines each formed in parallel with the main bit lines and between vertical arms of two neighboring second sub-bit lines;

a plurality of word lines formed in perpendicular with the main bit lines;

a plurality of main bank selection lines formed in parallel with the word lines for selecting a memory block; and a plurality of sub-bank selection lines formed within each memory block for selectively connecting neighboring second and third sub-bit lines so as to select a corresponding sub-bank.

2. The NOR type mask ROM of claim 1 wherein the main bit lines are made of metal.

3. The NOR type mask ROM of claim 1 wherein a plurality of memory cells are formed with the vertical arms of the second sub-bit lines and the third sub-bit lines being drains and sources of the memory cells, and the word lines being gates of the memory cells for selectively accessing the memory cells.

4. The NOR type mask ROM of claim 1 wherein a plurality of main bank selection transistors are formed with the first sub-bit lines and the horizontal arms of the second sub-bit lines being drains and sources of the main bank selection transistors, and the main bank selection lines being gates for selecting the main bank selection transistors.

5. The NOR type mask ROM of claim 1 wherein a plurality of sub-bank selection transistors are formed with both vertical and horizontal arms of the second sub-bit lines and the third sub-bit lines being drains and sources of the sub-bank selection transistors, and the sub-bank selection lines being gates for selecting the sub-bank selection transistors.

* * * * *